US008797761B2

(12) United States Patent
Mruz

(10) Patent No.: US 8,797,761 B2
(45) Date of Patent: Aug. 5, 2014

(54) ULTRA-WIDEBAND ASSEMBLY SYSTEM AND METHOD

(76) Inventor: John Mruz, East Northport, NY (US)

( * ) Notice: Subject to any disclaimer, the term of this patent is extended or adjusted under 35 U.S.C. 154(b) by 311 days.

(21) Appl. No.: 13/310,621

(22) Filed: Dec. 2, 2011

(65) Prior Publication Data

US 2012/0075820 A1 Mar. 29, 2012

Related U.S. Application Data

(62) Division of application No. 12/080,646, filed on Apr. 4, 2008, now Pat. No. 8,072,773.

(51) Int. Cl.
*H05K 7/00* (2006.01)

(52) U.S. Cl.
USPC ........... 361/782; 361/799; 333/181; 333/185; 333/245; 343/895; 244/63

(58) Field of Classification Search
USPC .................. 361/782, 799; 333/181, 185, 245; 343/895; 244/63
See application file for complete search history.

(56) References Cited

U.S. PATENT DOCUMENTS

| 3,633,210 | A | * | 1/1972 | Westerman et al. | 343/895 |
|---|---|---|---|---|---|
| 3,812,438 | A | | 5/1974 | Hopfer | 333/246 |
| 4,543,208 | A | | 9/1985 | Hone et al. | 252/62.54 |
| 4,795,113 | A | * | 1/1989 | Minovitch | 244/63 |
| 4,893,105 | A | | 1/1990 | Maeda et al. | 336/84 |
| 5,321,965 | A | | 6/1994 | Baird | 72/142 |
| 5,650,920 | A | | 7/1997 | Pfizenmayer | 361/782 |
| 5,739,736 | A | | 4/1998 | Lee | 336/65 |
| 5,838,215 | A | | 11/1998 | Gu et al. | 333/181 |
| 6,236,289 | B1 | * | 5/2001 | Slenker | 333/181 |
| 6,344,781 | B1 | * | 2/2002 | Slenker | 333/181 |
| 6,509,821 | B2 | * | 1/2003 | Oldfield | 336/82 |
| 6,944,009 | B2 | | 9/2005 | Nguyen et al. | 361/328 |
| 7,132,919 | B2 | | 11/2006 | Neumann et al. | 336/192 |
| 7,142,086 | B2 | | 11/2006 | Nguyen et al. | 336/231 |
| 7,248,458 | B2 | | 7/2007 | Mruz | 361/303 |
| 8,072,773 | B2 | | 12/2011 | Mruz | 361/782 |
| 2002/0080002 | A1 | * | 6/2002 | Oldfield et al. | 336/231 |
| 2004/0004527 | A1 | * | 1/2004 | Geller et al. | 336/225 |
| 2004/0070482 | A1 | | 4/2004 | Golan | 336/223 |
| 2004/0227596 | A1 | * | 11/2004 | Nguyen et al. | 333/245 |
| 2005/0093670 | A1 | * | 5/2005 | Neumann et al. | 336/208 |
| 2005/0093672 | A1 | | 5/2005 | Harding | 336/223 |

(Continued)

FOREIGN PATENT DOCUMENTS

| EP | 1 189 247 | 7/2002 |
|---|---|---|
| GB | 828291 | 2/1960 |

(Continued)

*Primary Examiner* — Xiaoliang Chen
(74) *Attorney, Agent, or Firm* — Mintz Levin Cohn Ferris Glovsky and Popeo, P.C.

(57) ABSTRACT

An ultra-wideband assembly is provided. The assembly includes a non-conductive tapered core having a conductive wire wound on an outer surface of the non-conductive tapered core, a low-frequency inductor coupled to the non-conductive tapered core via the distal end of the conductive wire and configured to allow mounting of the non-conductive tapered core at an angle with respect to the circuit board. The low frequency inductor is being disposed on a dielectric board configured to be coupled to the circuit board. The assembly includes an ultra-wideband capacitor coupled to the non-conductive tapered core via the proximate end of the conductive wire, the ultra-wideband capacitor being also coupled to the transmission line on the dielectric board.

30 Claims, 10 Drawing Sheets

(56) References Cited

U.S. PATENT DOCUMENTS

| | | | |
|---|---|---|---|
| 2006/0114077 A1 | 6/2006 | Mizuno et al. | 333/33 |
| 2006/0139124 A1* | 6/2006 | Fojas | 333/185 |
| 2006/0290460 A1 | 12/2006 | Waffenschmidt et al. | 336/223 |
| 2007/0139153 A1 | 6/2007 | Lai | 336/212 |
| 2007/0152795 A1 | 7/2007 | Zeng et al. | 336/212 |
| 2007/0164843 A1* | 7/2007 | Yagisawa et al. | 336/83 |

FOREIGN PATENT DOCUMENTS

| | | |
|---|---|---|
| GB | 1 407 151 | 9/1975 |
| JP | 2004-137507 | 5/1992 |
| JP | 2004-006695 | 1/2004 |
| JP | 2004-047942 | 2/2004 |
| JP | 2005-0722310 | 3/2005 |
| WO | WO 2004/730392 | 8/2004 |

* cited by examiner

ULTRA-WIDEBAND ASSEMBLY SYSTEM AND METHOD

CROSS-REFERENCE TO RELATED APPLICATIONS

This application is a divisional of and claims priority to U.S. patent application Ser. No. 12/080,646, filed Apr. 4, 2008, the disclosure of which is fully incorporated herein by reference in its entirety for all purposes.

BACKGROUND OF THE INVENTION

1. Field of the Invention

The present invention generally relates to electrical circuits. Specifically, the present invention relates to ultra-wideband assembly systems and methods that provide a wide range of operational frequencies with low insertion loss.

2. Background of the Invention

With the development of multi-media technology, there is an increasing demand for constructing optical communication networks that are capable of providing transmissions at high speeds and accommodating large volumes of information. There is also a demand to provide such transmissions at lowered costs and over long distances. Various conventional systems that provide transmission high rates between 10 Gb/s to over 40 Gb/s have been developed or are currently under development.

To accommodate such high speeds of transmission, electronic circuits having bias-tee (also referred to as "bias-T") packages disposed on transmitter-receivers have been developed. A conventional bias-tee circuit is in actuality a form of a multiplexer having three ports arranged in the shape of a "T" and having frequencies ranging from below 30 KHz to at least 40 GHz pass horizontally through the T, and combine with much lower frequencies including DC from the bottom path used to bias and/or modulate transistors, diodes, and passive circuits. The circuit is a simple composition of one capacitor and one coil with some attention paid to details.

In the conventional systems, the construction of a horizontal bar of the T is based on one or more of the many forms of transmission line having low-loss, non-conducting material, including gas, act as a dielectric. At one point, a small slice is cut out from the transmission line conductor. Thus, a capacitor is formed and low frequencies are blocked. This kind of capacitor has an advantage that it is nearly invisible to higher frequencies. To pass frequencies of typically several mega-Hertz and lower, the capacitance has to be increased. An ultra-wideband capacitor, such as type 545L capacitor manufactured by American Technical Ceramics Corporation, and disclosed in the co-owned U.S. Pat. No. 7,248,458 to Mruz, the disclosure of which is incorporated herein by reference in its entirety, can be configured to accomplish this task without adding significant perturbations to the insertion loss and return loss characteristics of the original straight-through line.

A small coil made of fine wire with an air core, a dielectric core, ferrite core, or a powdered iron core connects the inner conductor of one of the sides of the capacitor with the port in the outer conductor leading down the T. Frequencies above of approximately 16 KHz hit the coil at the small end. Because of increasing diameters of the coil as the windings progress along the tapered length of the core, its resonances are distributed across the entire frequency range of the T causing its inductive reactance characteristic to vary uniformly with frequency. This results in a virtually resonance-free increase in the inductiveness of the coil, which, in-turn, causes a linear reduction in an RF leakage from the transmission line, as the frequency increases. Because of size constraints, this type of singe layer, tapered coil cannot be made with enough inductance to sufficiently prevent RF leakage that occurs at very low frequencies. Thus, conventional systems implement a second coil, having considerably more inductance, to be placed in-series with the first tapered coil starting at the large end of the first tapered coil.

Any resonances that may result from the larger coil and interactions between these two tandem coils are dampened by two resistors placed across the larger coil and in-series with both coils, respectively.

The conventional bias-tee packages are commonly used for biasing of photodiodes (vacuum and solid state), Microchannel plate detectors, transistors, and triodes. This stops high frequency energy from leaking onto a common power supply rail and stops noise from the power supply from leaking onto the signal line.

The conventional systems employing the bias-tee packages suffer high and erratic insertion loss (i.e., a decrease in transmitted signal power) when operated over a wide range of operational frequencies. Thus, there is a need for a system that can operate in a wide range of frequencies and with low and well-behaved insertion loss.

SUMMARY OF THE INVENTION

The present invention relates to electrical circuits and more specifically to ultra-wideband assembly systems and methods. In some embodiments, the present invention relates to an ultra-wideband assembly including a non-conductive tapered core having an outer surface, an optional layer of dielectric being disposed on at least a portion of the outer surface of the non-conductive tapered core, a distal end, and a proximate end. The distal end being larger than the proximate end. The assembly includes a conductive wire having a proximate end and a distal end and being wound about at least a portion of the non-conductive tapered core. The proximate end of the conductive wire extends away from the proximate end of the non-conductive tapered core. The distal end of the conductive wire extends away from the distal end of the non-conductive tapered core.

In some embodiments, the present invention relates to an ultra-wideband assembly in an electrical circuit having a circuit board with a conductive micro-strip line. The assembly includes a conductive tapered core having an outer surface, a distal end, and a proximate end. The distal end being larger than proximate end. The assembly includes a conductive wire having a proximate end and a distal end and being wound about at least a portion of the non-conductive tapered core. The proximate end of the conductive wire extends away from the proximate end of the non-conductive tapered core and is being conductively coupled to the micro-strip line of the circuit board. The distal end of the conductive wire extends away from the distal end of the non-conductive tapered core. The assembly further includes a supporting bracket having a base portion and a core attachment portion. The base portion is being conductively coupled to the circuit board. The core attachment portion is being coupled to the distal end of the non-conductive tapered core and is further being conductively coupled to the distal end of the conductive wire.

In other embodiments, the present invention relates to an ultra-wideband assembly that includes a non-conductive tapered core having an outer surface, a distal end, and a proximate end. The distal end being larger than proximate end. The assembly includes a conductive wire having a proximate end and a distal end and being wound about at least a portion of the non-conductive tapered core. The proximate end of the conductive wire extends away from the proximate end of the non-conductive tapered core. The distal end of the conductive wire extends away from the distal end of the non-conductive tapered core. The assembly further includes a dielectric layer disposed on top of at least a portion of the conductive wire being wound on the non-conductive tapered core, the dielectric layer being disposed substantially near the proximate end of the conductive tapered core. The assembly also includes a metal pad coupled to the dielectric layer at the proximate end of the non-conductive tapered core.

In alternate embodiments, the present invention relates to a capacitor assembly for an electrical circuit having a transmission line. The assembly includes a capacitor and a dielectric board. The capacitor is configured to be mounted to the dielectric board using a low-loss, high-temperature epoxy or some other appropriate low loss bonding agent. An air space is created between where the capacitor is mounted to the dielectric board. The capacitor is configured to be coupled to the transmission line. The capacitor assembly is configured to minimize perturbation of the electric field of the transmission line.

In some embodiments, the present invention relates to an ultra-wideband assembly in an electric circuit having a circuit board having a transmission line. The assembly includes a non-conductive tapered core having a conductive wire wound on an outer surface of the non-conductive tapered core, the conductive wire having a proximate end and a distal end, a low-frequency inductor coupled to the non-conductive tapered core via the distal end of the conductive wire and configured to allow mounting of the non-conductive tapered core at an angle with respect to the circuit board. The low frequency inductor is being disposed on a dielectric board configured to be coupled to the circuit board. The assembly also includes an ultra-wideband capacitor coupled to the non-conductive tapered core via the proximate end of the conductive wire. The ultra-wideband capacitor being coupled to the dielectric board and to the transmission line.

In some embodiments, the present invention relates to an inductor assembly that includes a multi-dimensional polygonal core having an outer surface, a distal end having a conductive metal pad, a proximate end having another conductive metal pad, a conductive wire having a proximate end and a distal end and being wound about at least a portion of the multi-dimensional polygonal core. The proximate end of the conductive wire is being coupled to another conductive metal pad of the proximate end. The distal end of the conductive wire is being coupled to the conductive metal pad of the distal end.

Further features and advantages of the invention, as well as structure and operation of various embodiments of the invention, are disclosed in detail below with references to the accompanying drawings.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The present invention generally relates to electrical circuits and more specifically, the present invention relates to ultra-wideband assembly systems and methods that improve operational frequencies of electrical circuits.

In some embodiments, the present invention relates to a non-conductive tapered core assembly for mounting the core in an electrical circuit to improve operational frequency range. FIGS. 1a-h illustrate an exemplary non-conductive tapered core 100, according to some embodiments of the present invention. The core 100 has a shape of a pyramidelepiped (i.e., a pyramid having a parallelogram base). In some embodiments, the core 100 can be a square, a rectangular, a triangular, a polygonal, or any other type pyramidal or other multi-dimensional structure. In some embodiments, the core 100 can be manufactured from powdered iron particles.

Figure 1A:
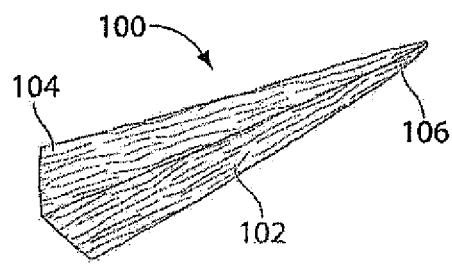
FIGS. 1a-i illustrate exemplary non-conductive tapered cores, according to some embodiments of the present invention.
Figure 5A:
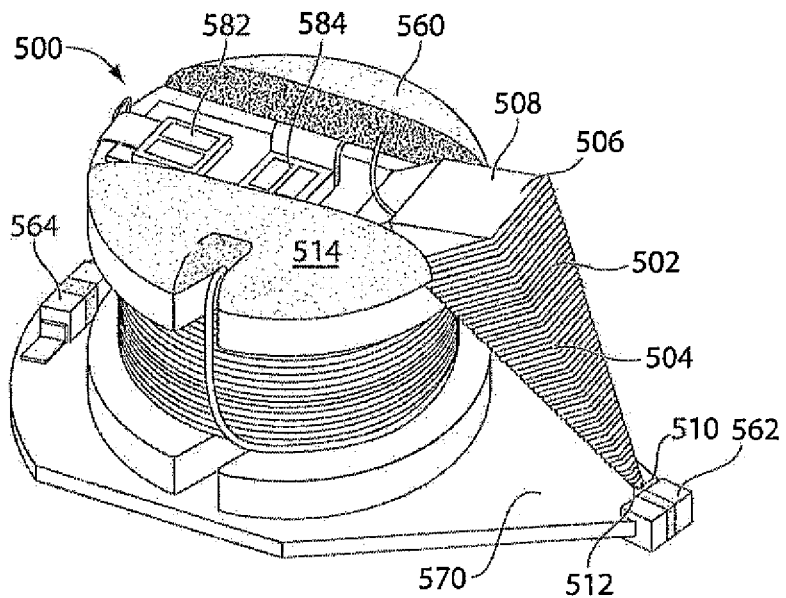
FIGS. 5a-f illustrate exemplary bias-tee assemblies, according to some embodiments of the present invention.
Figure 5B:
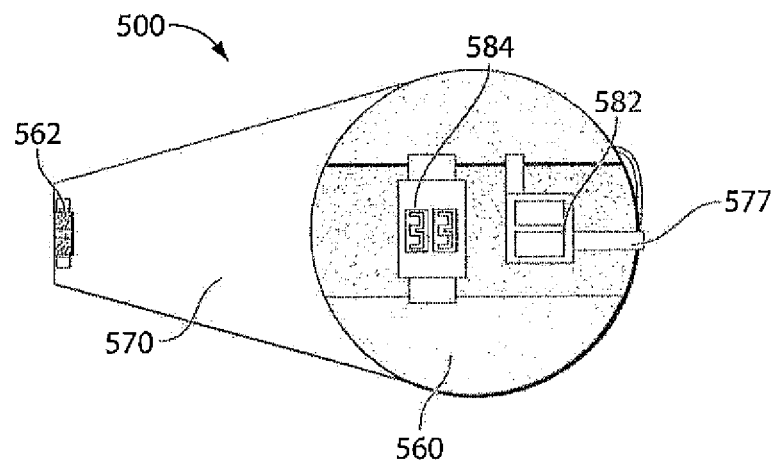
Figure 5C:
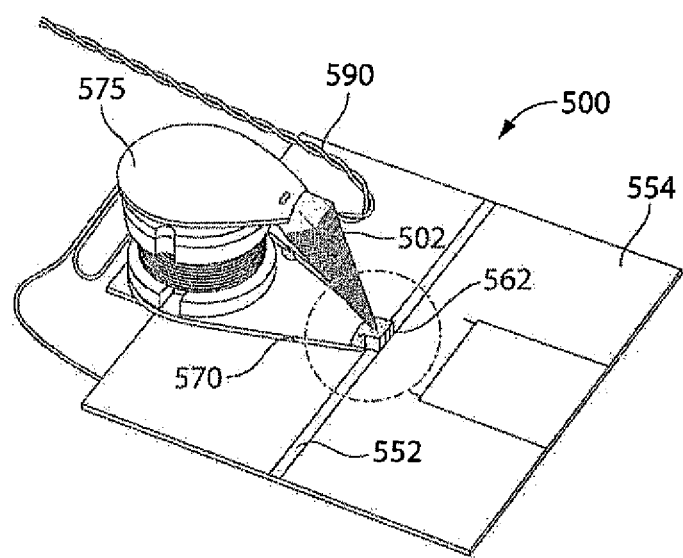

FIG. 1a illustrates an exemplary powdered core 100, according to some embodiments of the present invention. As illustrated, the core 100 is configured in a form of a pyramidelepiped. As can be understood by one skilled in the art, the form of the core 100 can be varied and the core can have a tetrahedron pyramid shape (as shown in FIG. 1a), a triangular pyramid shape (as shown in FIG. 1g), or any other multi-dimensional polygonal shape (as shown in FIG. 1h). One of the advantages of the pyramidelepiped core 100 shown in FIG. 1a, is that it is easier to form and wind than other shapes of the core. Further, the core having a square cross-section provides a typical inductance of 12 µH when #47 copper wire that is coated with single-build FORMAR® material or is fully wound on a 0.250 inch long taper with a 0.064 inch square distal end and a sharp pointed proximate end. As can be understood by one skilled in the art, other inductances along with different types of wiring and sizing can be used. The above example is provided for exemplary non-limiting purpose. The triangular and flat shaped cores, as shown in FIGS. 1g and 1h, may be physically suited in specific applications, for example, accommodation of drop-on assemblies. The cores shown in FIGS. 1a-f are configured to include a tapering angle α, which can be defined as twice the angle formed by one of the facets of the pyramidelepiped triangular cores with a plane that intersects the vertex of pyramidelepiped and is perpendicular to the base of the pyramidelepiped (as shown in FIG. 1i, illustrating a two-dimensional view of the tapered core 100). In some embodiments, the tapering angle α can be in a range from less than 10 degrees to greater than 25 degrees. In alternate embodiments, the tapering angle α can be in a range of 17-19 degrees. In yet other embodiments, the tapering angle α can be 18 degrees. In some embodiments, the tapering angle can be uniform throughout the pyramidelipiped. In alternate embodiments, the tapering angle can vary from facet to facet of the pyramidelipiped. Also, the tapering angle of the core can vary according to the angle of mounting of the core assembly with respect to the circuit board (as illustrated in FIGS. 5a-c). Depending on the applications, the tapering angle can be a function of the angle of mounting of the core assembly on the circuit. In some embodiments, the tapering angle can be a function of the angle of mounting of the core assembly on the circuit (and vice versa).

The core 100 has an outer surface 102, a distal end 104, and a proximate end 106. The distal end 104 is configured to be larger than the proximate end 106. The proximate end 106 is configured to be mounted adjacent to a transmission line on a circuit board, as will be discussed below.

A surface area of vertex of the pyramidelepiped shown in FIG. 1a can be configured to be a sharp point having a surface area of substantially zero. This allows forming a sharp point with the wire that is being wound up to the vertex of the pyramidelipiped. In some alternate embodiments, the surface area of the vertex point can be configured to be in the range between 0 to approximately 0.000025 square inches. A surface area of each of the side facets of the pyramidelepiped shown in FIG. 1a is configured to be on the order of between 0.007951 square inches for the blunt tip and 0.00800 square inches for the sharp tip in this, specific example. The surface area of the distal end (i.e., the parallelogram) is configured to be on the order of approximately 0.0041 square inches. As can be understood by one skilled in the art, the above values are provided for exemplary, non-limiting purposes, and other surface areas are possible.

Figure 1B:
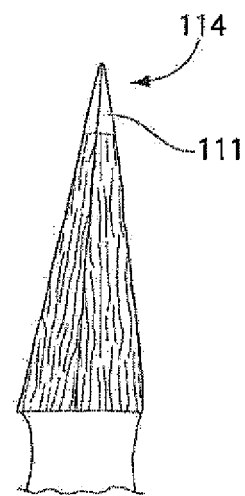
Figure 1C:
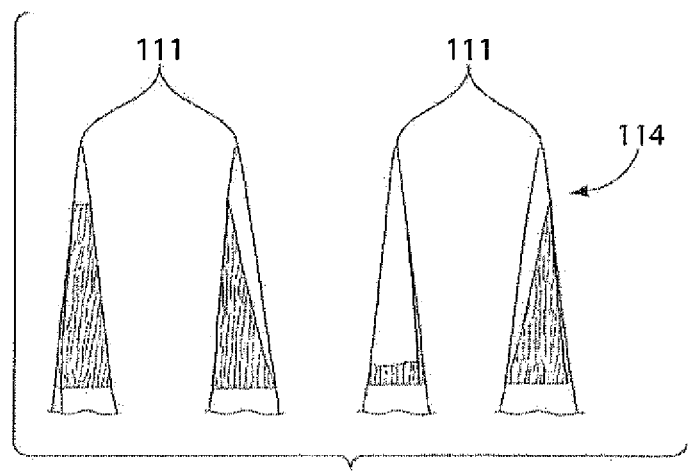

FIGS. 1b and 1c illustrate exemplary embodiments of the powdered core 114 having a dielectric 111 disposed partially on the outer surface of the core, according to some embodiments. FIG. 1b illustrates that the dielectric 111 is disposed adjacent the proximate end of the powdered core 114. The dielectric material 111 is configured to lower the coil's insertion loss at higher frequencies (i.e., frequencies typically above 300 MHz). Additionally, the core material is separated from the RF end of the coil, which causes the lowering of resulting insertion loss when placed near a transmission line. In some embodiments, the dielectric material 111 can be configured to assist in formation of the soft iron into the shape of the powdered core 114, and thus, allows for formation of a sharp vertex of the pyramidelipiped. Additionally, the dielectric material 111 can also be configured to serve as a protective measure, thereby preventing breakage of the powdered iron core during winding operations. In some embodiments, the dielectric material is Rogers TMM6 material, available from Rogers Corporation, Rogers, Conn., USA. Other dielectric materials that can be used to replace portions of the powdered iron core include dielectric materials having a dielectric constant (which is defined as a measure of the extent, under given conditions, to which the material concentrates electrostatic lines of flux) of eight or below.

FIG. 1b illustrates that the dielectric 111 is disposed throughout the proximate region of the powdered core 114. In some embodiments, the dielectric 111 can be disposed on the core 114 in a tapering fashion and configured to replace a portion of the core 114, so that the core 114 appears smooth and without any protrusions, as illustrated in FIG. 1c, which shows four orthogonal views of the same core. Such tapering disposition of dielectric also allows for a gradual change in the length of the turns of the wiring. Such gradual change in length of the turns is configured to allow better distribution of resonances of the coil winding. This can be advantageous for some application as compared to the core assembly shown in FIG. 1b, where dielectric is applied only to the tip of the core assembly and coil windings experience a sharp change along its winding length, which may cause small resonance effect that will generate insubstantial variations in the swept insertion loss response. These variations are not noticeable where the tapered dielectric, shown in FIG. 1c, is employed. However, the inductance of the coil assemblies with tapered dielectric, shown in FIG. 1c, is less than the coil assemblies with a dielectric being disposed at the tip of the core, as shown in FIG. 1b. As can be understood by one skilled in the art, the dielectric material can be disposed on the core according to any desired configuration of the system using the coil assemblies, as shown in FIGS. 1b-c.

Figure 1D:
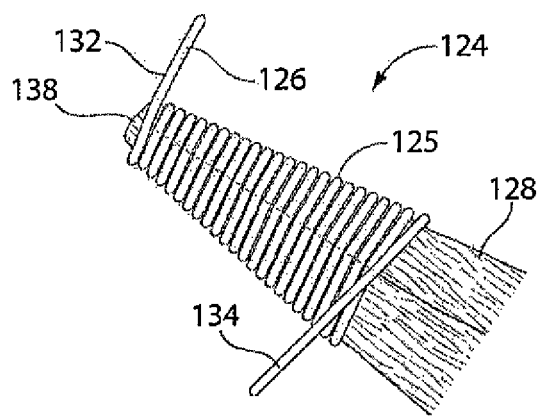
Figure 1E:
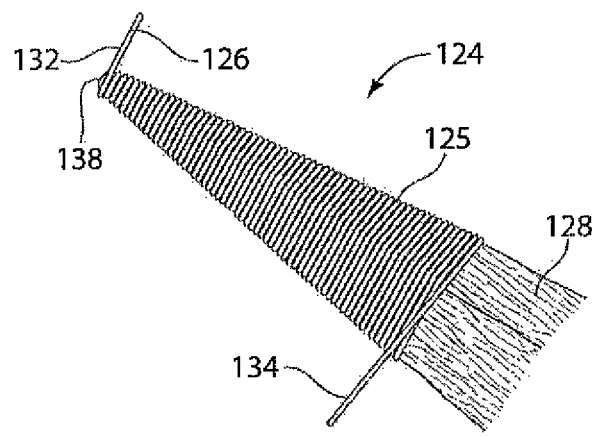
Figure 1F:
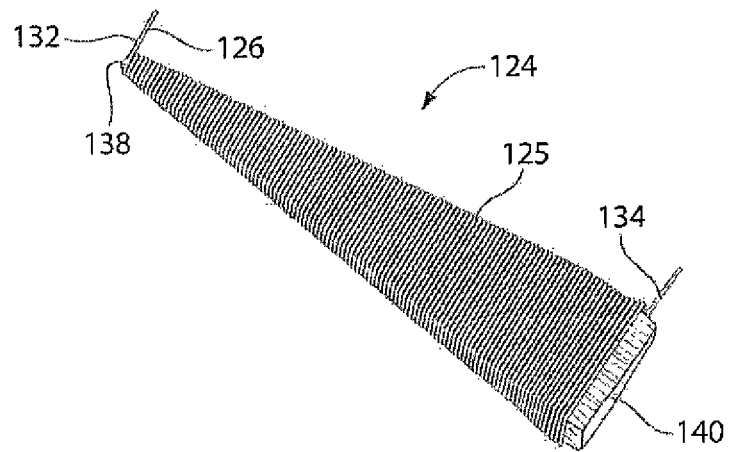
Figure 1G:
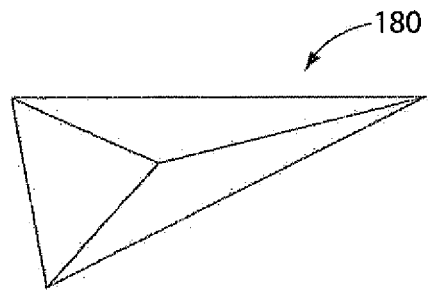
Figure 1H:
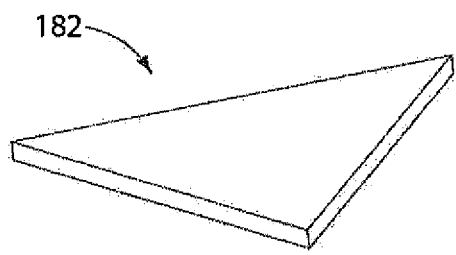
Figure 1I:
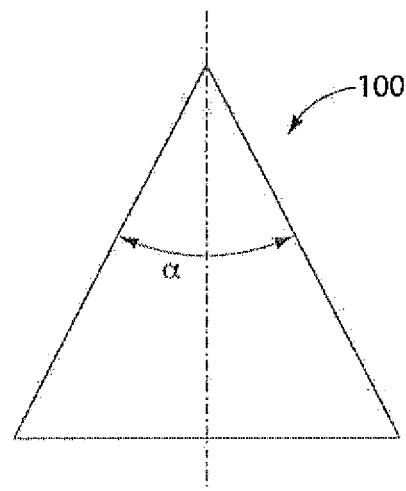

FIGS. 1d-1f illustrate exemplary embodiments of the powdered core 124 having a conductive wire 126 wound (forming a winding 125) on the outer surface 128 of the core 124, according to some embodiments of the present invention. The conductive wire 126 includes a proximate end 132 and a distal end 134. The proximate end 132 is configured to be disposed substantially adjacent the proximate end 138 of the core 124. The distal end 134 is configured to be disposed substantially adjacent the distal end 140 of the core 124. The proximate end 132 is configured to connect the conductive wire 126 to a transmission line of the electrical circuit (not shown in FIG. 1d). The proximate end 132 of the wire 126 is further configured to extend away from the proximate end 138 of the core 124. The distal end 134 can be configured to be coupled to an inductor (not shown in FIG. 1d, but is shown in FIGS. 5a-f below). The distal end 134 of the wire 126 is configured to extend away from the distal end 140 of the core 124.

The proximate end 132 of the conductive wire 126 is configured to extend in the range of 0 inches to approximately 0.010 inches (in some embodiments, the proximate end 132 can extend in the range of 0.001 inches to less than 0.006 inches) away from the proximate end 138 of the core 124. In some embodiments, the length of proximate end 132 of the conductive wire 126 extending from the proximate end 138 of the core 124 is approximately 0.006 inches.

The conductive wire 126 is configured to have a diameter in the range of about 0.001 inches to about 0.013 inches. In some embodiments, the range of diameters of the wire can be from 0.005 inches to about 0.009 inches. In some embodiments, the diameter is equal to about 0.0007 inches. In some applications and embodiments, the diameter of the wire can extend beyond the 0.001 to 0.013 inches range. These applications relate to both the required inductance valve and the current carrying capacity of the coil which interdependently relate to both wire diameter and wire length (as length relates to the number of turns). Such applications include amplifier front-end and driver stage decoupling networks, varactor diode bias voltage RF isolation inductors, and PIN switch DC driver networks. As can be understood by one skilled in the art, other diameters of the wire are possible. The wire 126 is configured to be wound around the entire conductive core 124. In some embodiments, the wire 126 is configured to be wound around a portion of the conductive core 124. Such partial winding can be useful in applications such as those shown in and discussed in connection with FIG. 5a. In these embodiments, the distal end of the core assembly is sometimes machined off at an odd angle to make it compatible (mechanically or otherwise) with another coil assembly to which the first assembly is being coupled.

As illustrated in FIGS. 1d-1f, the wire 126 is wound around the core 124 so that there is substantially no spacing between the turns of the wire 126, i.e., the wire 126 is being tightly wound around the core 124. In some applications and/or as desired, the wire 126 can be wound around the core 124 with some predetermined spacing. This spacing can either be constant along the length of the coil or it can vary along the length of the coil.

In some embodiments where the above tapered coils are used, the ultra-wideband assembly formed by the core and the windings discussed above, when connected in a circuit are configured to maintain signal levels (or minimize insertion loss, which is the decrease in transmitted signal power resulting from the insertion of a device in a transmission line or optical fiber) in a frequency range of below 70 MHz to at least 40 GHz. In some embodiments where smaller tapered coils are employed, the lower frequency attenuation limits can be moved substantially higher than the 70 MHz and remain extended to at least 40 GHz. In some embodiments, the present invention's assemblies are configured to maintain signal levels (or minimize insertion loss) to below 1.0 decibel ("dB") in a frequency range of at least 16 KHz to 40 GHz. Further, in some embodiments, the present invention's assemblies can be configured to maintain signal levels in a range from below 100 KHz to over 100 GHz range.

There are various ways to manufacture the tapered core 124. In some embodiments, the tapered core can be pressed into a mold by conventional press equipment that is configured to press iron cores into a desired shape (or one shown in FIGS. 1a-h). One of the issues involved with using a mechanical press to manufacture tapered core is the fragility of the tapered core. Because of this characteristic, it is difficult to form a sharp point of the core (as shown in FIGS. 1a-1f), i.e., it typically breaks off.

In some embodiments, the material, i.e., iron powder, can be mixed with epoxy into a thick colloidal paste and then poured into a mold that has been sprayed with a release agent. The release agent is a substance used in molding and casting that aids in the separation of a mold from the material being molded and reduces imperfections in the molded surface. In this case, the examples of a release agent that can be used are typical non-contaminating release polymers manufactured by Frekote and others. Wax and silicon agents can also be employed. As can be understood by one skilled in the art, other types of release agents can be used. One of the issues involved in this method of manufacturing the powdered core is that the epoxy that is suspended along with the iron particles makes the core somewhat ineffective as compared to the core without the epoxy. Thus, the resulting inductance of the core with the epoxy is only typically about 70% of what it could be without the epoxy.

Another way to manufacture the powdered core is to take a pressed rod (or any other configuration) and sanded it into the configuration shown in FIGS. 1a-f. Then, in some embodiments, the sanded core can be coated with a thin varnish to strengthen it. Subsequent to the coating step, wire can be wound around the core starting at the proximal (or pointed end). In some embodiments, the winding can start within three turns of the pointed end.

In some embodiments, the inductance value of the tapered coil assemblies illustrated in FIGS. 1a-h can range from 2 microhenries ("µH") to over 20 µH. In alternate embodiments, the inductance value can range from 5-12 µH. Yet in other alternate embodiments, the inductance value of the assembly can be 10 µH.

As can be understood by one skilled in the art, the length of the core and the distal end cross-section dimensions can vary based upon, for example, the number of turns of the wire that are desired, as well as any other parameters of the assembly. In some embodiments, the area of the proximate tip does not vary.

Figure 2A:
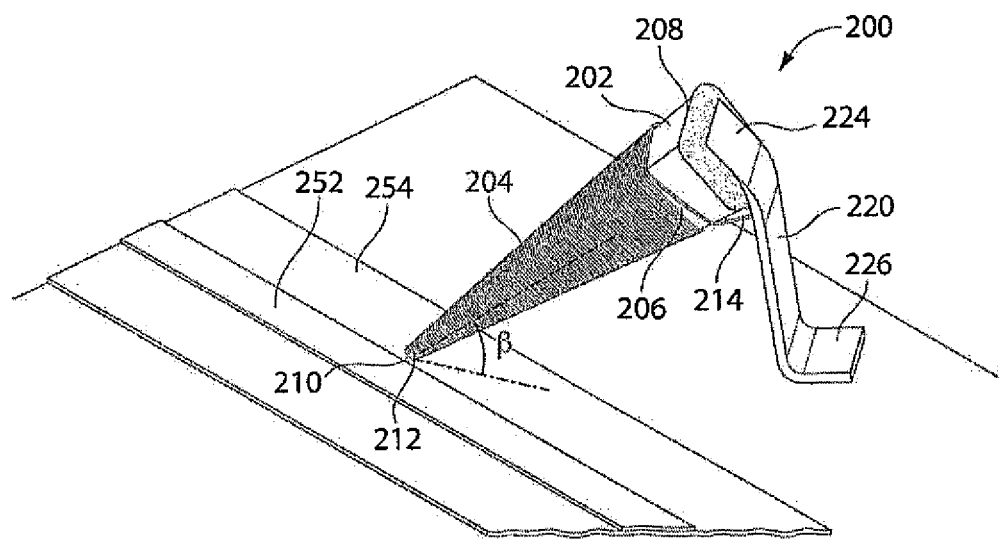
FIG. 2a-b illustrates exemplary non-conductive tapered core assemblies having a metal bracket, according to some embodiments of the present invention.

FIG. 2a illustrates an exemplary ultra-wideband assembly 200 that includes the conductive tapered core 202 having a metal bracket 220 configured to be coupled to the core 202 to the circuit board 254, according to some embodiments of the present invention. The core 202 includes a conductive wire winding 204 configured to be wound around the core 202 in a fashion similar to the winding around core 101 illustrated in FIGS. 1a-h. The conductive tapered core 202 includes an outer surface 206, a distal end 208, and a proximate end 210. The distal end 208 is configured to have a larger surface area than the proximate end 210. The proximate end 210 is configured to be disposed substantially adjacent a micro-strip transmission line 252 of the circuit board 254. The conductive wire 204 includes a proximate end 212 and a distal end 214. The proximate end 212 is configured to be disposed substantially adjacent the proximate end 210 of the core 202. The distal end 214 is configured to be disposed substantially adjacent the distal end 208 of the core 202. The proximate end 212 of the wire 204 is configured to be connected to the transmission line 252 of the circuit board 254. The distal end 214 of the wire 204 is configured to be coupled to a supporting bracket 220.

One end or a core attachment portion 224 of the bracket 220 is configured to be coupled to the distal end 208 of the core 202, as illustrated in FIG. 2a. Another end or a base portion 226 of the bracket 220 is configured to be coupled to the circuit board 254. The base portion 226 is also configured to be conductively coupled to the circuit board 254.

Figure 2B:
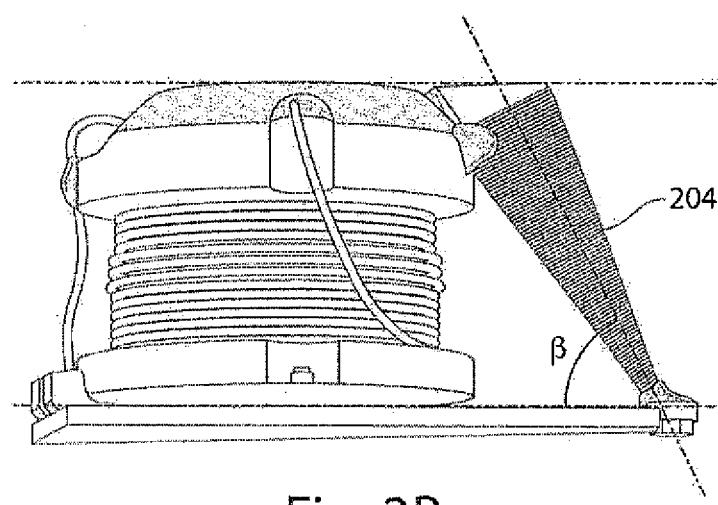

The bracket 220 is configured to position the core 202 having the winding 204 at a particular angle β with respect to the circuit board 254. In some embodiments, the angle between the central axis of the tapered core 202 and the horizontal top surface of the micro-strip board in a range of greater than 25 degrees to 90 degrees (i.e., substantially vertical mounting of the core 202). In some embodiments, range of angles is in the range of 40 degrees to 70 degrees. In some embodiments, the angle β is 63 degrees to the micro-strip line, as illustrated in FIG. 2b.

Figure 3A:
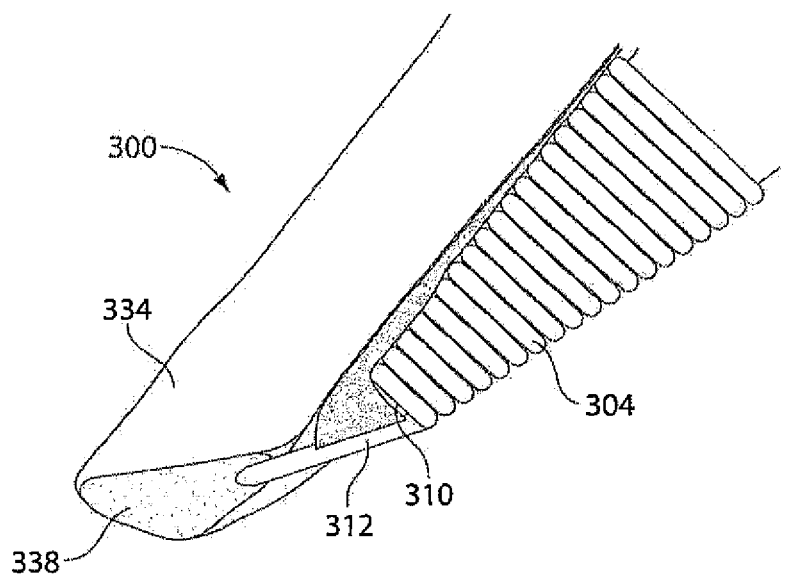
FIG. 3a illustrates exemplary non-conductive tapered core having a dielectric layer and a metal pad, according to some embodiments of the present invention.
Figure 3B:
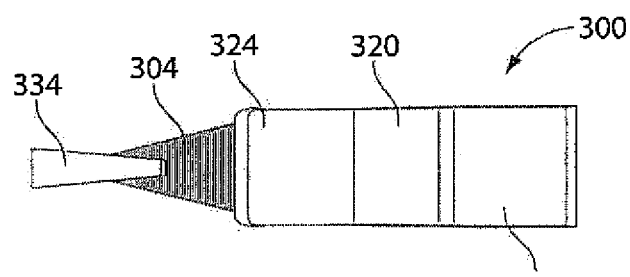
FIGS. 3b-c illustrate another exemplary non-conductive tapered core assemblies having a metal bracket, according to some embodiments of the present invention.
Figure 3C:
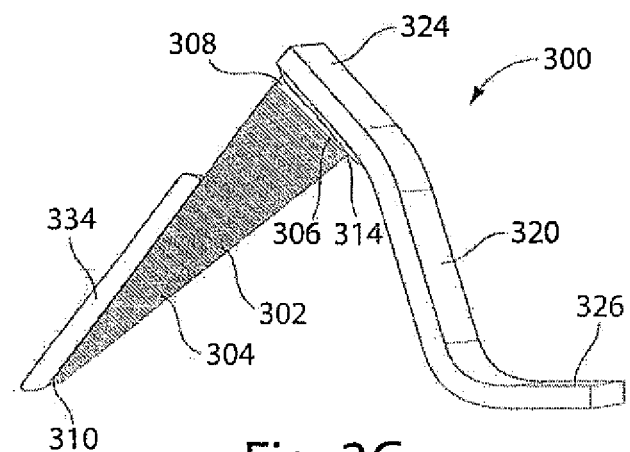

FIGS. 3a-c illustrate an exemplary ultra-wideband assembly 300 that includes the conductive tapered core 302 having a metal bracket 320 configured to couple the core 302 to the circuit board, according to some embodiments of the present invention.

The core 302 includes a conductive wire winding 304 configured to be wound around the core 302 in a fashion similar to the winding around core 101 illustrated in FIGS. 1a-h. The conductive tapered core 302 includes an outer surface 306, a distal end 308, and a proximate end 310. The distal end 308 is configured to have a larger surface area than the proximate end 310. The proximate end 310 is configured to be disposed substantially adjacent a micro-strip transmission line of a circuit board (not shown in FIGS. 3a-c). The conductive wire 304 includes a proximate end 312 and a distal end 314. The proximate end 312 is configured to be disposed substantially adjacent the proximate end 310 of the core 302. The distal end 314 is configured to be disposed substantially adjacent the distal end 308 of the core 302. The proximate end 312 of the wire 304 is configured to be connected to the transmission line of the circuit board.

In some embodiments, the ultra-wideband assembly 300 includes a dielectric layer 334 that is configured to be disposed substantially near the proximate end 310 of the core 302. In some embodiments, the dielectric layer 334 is configured to be disposed on top of at least a portion of the conductive wire 304. The thickness of the dielectric layer 334 can be in the range from 0.004 inches to about 0.015 inches. The thickness of the dielectric layer 334 can be on the order of approximately 0.010 inches. In some embodiments, the material of the dielectric layer can be Rogers RO4350, manufactured by Rogers Corporation, Conn., USA, which is a hydrocarbon ceramic loaded glass. This material is characterized by its strength, mechanical rigidity and stability over a wide range of temperatures. Other similar low loss, low dielectric constant materials with a thicknesses of 0.010 inches or less can be used if so desired.

In alternate embodiments, the thickness of the dielectric layer can vary throughout the dielectric layer 334. Further, in some embodiments, the dielectric layer can be disposed on one side of the tapered core, while leaving the other side free of the dielectric layer. In some embodiments where the dielectric layer is disposed on the top side of the wound core, the connection between the tip of the fine wire wound around the core and the micro-strip line (or any other type of transmission line), allows the tip to be closer to the micro-strip line, thereby reducing resonant responses. In the embodiments where the dielectric is disposed on the bottom side of the core, i.e., closer to the transmission line (which makes the tip of the wire disposed further away from the transmission line), the resonant responses may be enhanced.

In some embodiments, the dielectric layer includes a metal pad 338. The metal pad 338 is configured to be disposed on at least a portion of the dielectric layer 334 and substantially adjacent to the proximate end of the core 304. The metal pad 338 can be configured to provide a robust contact to the proximate end 312 of the wire 304. In some embodiments, the metal pad 338 has a thickness of approximately 0.0007 inches (i.e., the thickness of a half-ounce copper cladding). The surface area of metal pad 338 can be configured to be on the order of approximately 0.003 square inches (i.e., approximately 0.025 inches×0.012 inches). In some embodiments, the metal pad is configured to be manufactured from copper that is initially electrolessly deposited on the dielectric. Electroless plating is an auto-catalytic reaction used to deposit a coating of metal on a substrate. Unlike electroplating, it is not necessary to pass an electric current through the solution to form a deposit. Electroless plating has several advantages versus electroplating. Free from flux-density and power supply issues, it provides an even deposit regardless of the work piece geometry, and with the proper pre-plate catalyst, can deposit on non-conductive surfaces. Subsequent to the electroless plating, the tip of the dielectric material plated with copper is electroplated with either tin, a combination lead and tin, silver, gold, or any other suitable metal.

As illustrated in FIGS. 3a-c, the dielectric layer 334 along with the metal pad 338 are configured to protrude away from the proximate end 312 of the conductive core 304. The metal pad is configured to contact the transmission line of the circuit (not shown in FIGS. 3a-c).

In some embodiments, the dielectric layer 334 is manufactured from a pure ceramic, ceramic reinforced glass, or polytetrafluoroethene or polytetrafluoroethylene ("PTFE") based materials, PTFE materials reinforced with glass fibers, hydrocarbon ceramic composites, various rigid plastics, or any other suitable materials. The metal pad 338 is manufactured from copper, nickel, silver, gold, palladium, or any other suitable materials.

In some embodiments, the distal end 314 of the wire 304 is configured to be coupled to a supporting bracket 320. One end or a core attachment portion 324 of the bracket 320 is configured to be coupled to the distal end 308 of the core 302, as illustrated in FIGS. 3a-c. Another end or a base portion 326 of the bracket 320 is configured to be coupled to the circuit board. The base portion 326 is also configured to be conductively coupled to the circuit board 354. The bracket 320 is configured to position the core 302 having the winding 304 at a particular angle with respect to the circuit board (not shown in FIGS. 3a-c).

Figure 4A:
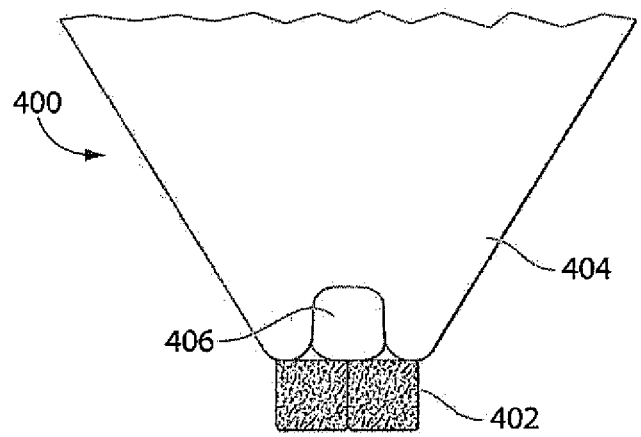
FIG. 4a-b illustrate exemplary capacitor(s) mounting, according to some embodiments of the present invention.

FIG. 4a illustrates an exemplary capacitance assembly system 400 for mounting a capacitor to a dielectric board to minimize assembly's perturbation of an electric field of a transmission line after mounting of the capacitor, according to some embodiments of the present invention. FIG. 4a illustrates a capacitor 402 mounted to a dielectric board 404. The capacitor 402 can be an ultra-broadband or any other capacitor. The capacitor 402 is configured to be mounted to the dielectric board 404 using a low loss, high temperature epoxy. In some embodiments, when the capacitor 402 is mounted to the dielectric board 404, an air space 406 is created between the capacitor 402 and the dielectric 404. When dielectric material is brought into close proximity with either a transmission line or an energy-carrying component, such as a capacitor, the dielectric material attracts energy into itself and changes the electrical characteristics of the item that it is drawing energy (i.e., electric field) from. This undesirable situation is minimized by removing as much of this dielectric as practical from the sensitive regions of these structures.

Figure 4B:
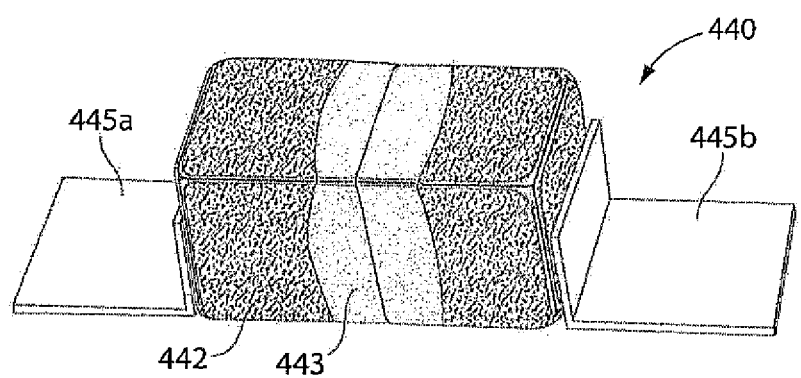

In some embodiments, the capacitor is configured to be directly attached to a transmission line of the circuit (not shown in FIG. 4a). In other embodiments, the capacitor can include ribbon leads 445 (a, b), as illustrated in FIG. 4b, that can be used to connect the capacitor to the transmission line of the circuit. The capacitor assembly 400 is configured to minimize perturbation of an electric field of the circuit's transmission line subsequent to mounting of the capacitor 402.

FIGS. 5a-f illustrate an exemplary embodiment of an ultra-wideband assembly 500 that includes a surface mountable ultra-broadband bias-tee, according to some embodiments of the present invention. The assembly includes a tapered core 502, an inductor 560, an ultra-wideband capacitor 562, a bypass capacitor 564, and resistors 582, 584.

The core 502 includes a conductive wire winding 504 configured to be wound around the core 502 in a fashion similar to the winding around core 101 illustrated in FIGS. 1a-h. The conductive tapered core 502 includes an outer surface 506, a distal end 508, and a proximate end 510. The distal end 508 is configured to have a larger surface area than the proximate end 510. The proximate end 510 is configured to be disposed substantially adjacent a micro-strip transmission line 552 of the circuit board 554. The conductive wire 504 includes a proximate end 512 and a distal end 514. The proximate end 512 is configured to be disposed substantially adjacent the proximate end 510 of the core 502. The distal end 514 is configured to be disposed substantially adjacent the distal end 508 of the core 502. The proximate end 512 of the wire 504 is configured to be connected to the transmission line 552 of the circuit board 554.

The distal end 508 of the core 502 is configured to be coupled to a low frequency inductor 560. The low frequency inductor 560 is configured to be mounted on dielectric substrate 570, which is in turn coupled to the circuit board 554, as illustrated in FIGS. 5a-f. In some embodiments, the inductor 560 has a value of 220 µH and is capable of handling 300 mA. As can be understood by one skilled in the art, the inductor 560 can have a different inductance values and can be capable of handling currents having different values. The above referenced numbers are provided here for exemplary purposes only and are not intended to limit the scope of the present invention.

Figure 5D:
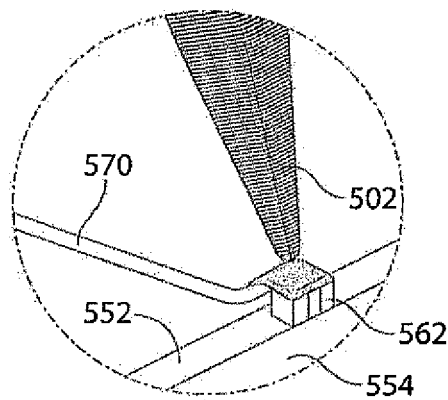
Figure 5E:
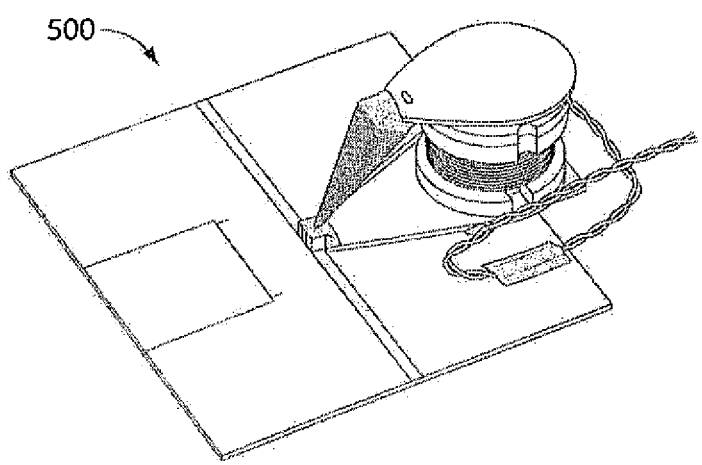

The ultra-wideband assembly 500 further includes an ultra-wideband capacitor 562 mounted to the dielectric substrate 570, as further illustrated in more detail in FIG. 5d. The capacitor 562 can be configured to be mounted to the dielectric substrate 570 in a similar fashion as the capacitor shown in FIGS. 4a-b. As such, the core 502 is configured to be coupled to the capacitor 562, which is in turn, can be configured to be coupled to the transmission line 552 of the circuit board 554. The capacitor 562 is coupled to the core near its proximate end 510 using the proximate end 512 of the conductive wire 504. In some embodiments, the capacitor 562 can be coupled directly to the transmission line 552. In alternate embodiments, the capacitor 562 can include conductive leads (shown in FIG. 4b) that can be coupled the transmission line 552.

Figure 5F:
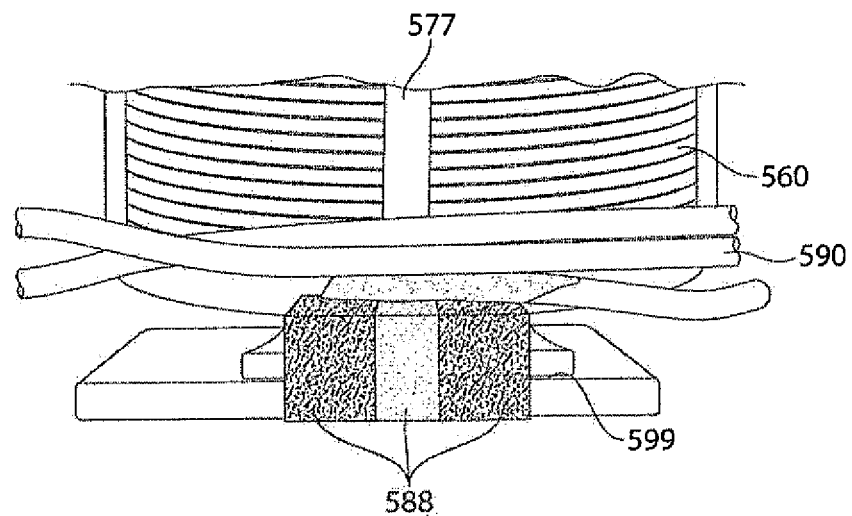

The assembly 500 further includes a bypass capacitor 564 mounted on the dielectric substrate 570. The capacitor 564 can be configured to be connected in parallel with the DC port of the bias T assembly to ground. In some embodiments, there can be more than one bypass capacitor 564 being connected to the bias T assembly 500. The bypass capacitor(s) 564 can be configured to short any RF energy signals leaking through the ultra-wideband inductor 560 and the core assembly 502 to ground. This is accomplished by having the bypass capacitor(s) 564 being connected to the "cold side" of the ultra-wideband inductor 560 and to ground. As illustrated in FIGS. 5a and 5f, the bypass capacitor(s) 564 is disposed in the rear of the assembly 500. As can be understood by one skilled in the art, the location of the bypass capacitor(s) 564 is not limited to being disposed in the rear of the bias-T assembly 500. The capacitors can be placed anywhere and then coupled to the assembly, as discussed above. In some embodiments, the capacitance of the bypass capacitor(s) 564 can range from 100 nano Farad ("nF") to over 220 nF. In some embodiments, the capacitance of the bypass capacitor(s) can extend beyond the above referenced range in various applications.

In some embodiments, the assembly 500 can further include a damping resistor 584 and an isolating resistor 582, as illustrated in FIGS. 5a-b. The resistor 584 is connected in-parallel with the ultra-wideband inductor 560 and is primarily used to dampen the resonant responses within that inductor 560. The resistor 582 is an isolating resistor that dampens any potential interactions between networks that may be coupled to the bias-T assembly 500 and their respective electrical DC feed lines. In some embodiments, the resistance of the damping resistor 584 is configured to be in a range of 180 Ohms and higher. The resistance of the isolating resistor 582 is configured to be in a range of approximately 0 Ohms to approximately 100 Ohms.

The dielectric or base substrate 570 material can be manufactured from any insulating, rigid, low loss dielectric, either a uniform composite or reinforced woven structure having a loss tangent (which is a measure of loss-rate of power of an electrical mode, such as an oscillation, in a dissipative system) of 0.005 or less and a dielectric constant of 10 or less would be acceptable. As can be understood by one skilled in the art, any other suitable materials can be used for the dielectric substrate 570.

In some embodiments, the ultra-wideband assembly 500 can be configured to attenuate signals in a frequency range of 16 KHz to about 40 GHz. In alternate embodiments, where smaller secondary coils are employed, the signals are attenuated in a frequency range of 300 KHz to about 40 GHz. In some embodiments, the upper and lower limits of the above frequency ranges can be specifically tailored to particular applications and can be configured to depend on the values of the inductor 560 and the coil assembly 502 as well as the ultra-wideband capacitor(s) 562. In some embodiments, the range of signal frequencies being attenuated can be from below 10 KHz to well over 100 GHz.

In some embodiments, the assembly 500 further includes a protective cover 575 configured to protect isolating and damping resistors 582 and 584, respectively. The cover 575 can be manufactured from any insulating, rigid, material that is either a uniform composite or reinforced woven structure. The assembly 500 can be further coupled to an external DC supply line 590, as illustrated in more detail in FIGS. 5a, 5c, and 5f. In some embodiments, Mylar tape or any other insulator 599 is configured to insulate bottom contact of the bias tee assembly from the micro-strip line ground contact. In some embodiments, the RF ground contact of the assembly is made with three bypass caps 588. As illustrated in FIG. 5b, the resistor 582 can be connected in series with a bias supply line 577.

Figure 5G:
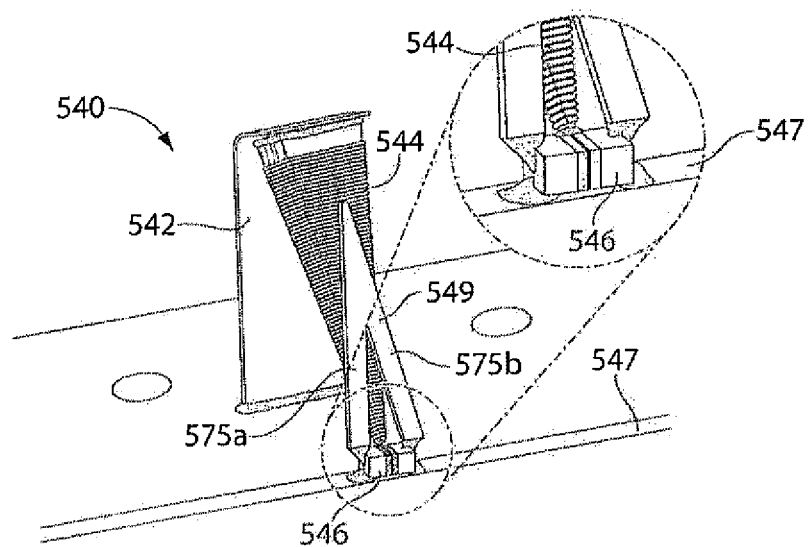
FIG. 5g illustrates another exemplary non-conductive tapered core assembly having a metal bracket, according to some embodiments of the present invention.

FIG. 5g illustrates an alternate embodiment of the bias-T assembly 540. The assembly 540 includes a supporting metal bracket 542, a coil assembly 544, and a capacitor assembly 546. The assembly 540 is connected to the micro-strip circuit line 547. The bracket 542 is similar to the brackets 220 and 320 discussed in connection with FIGS. 2a and 3a-c and can be configured to be coupled to the circuit board (not shown in FIG. 5c). The coil assembly 544 is similar to the coil assemblies discussed in connection with FIGS. 1a-3c and 5a-b. The capacitor assembly 546 is also discussed in connection with FIG. 4a. In some embodiments, the capacitor assembly 546 can be similar to the capacitor assembly 440 shown in FIG. 4b. As illustrated in FIG. 4b, the capacitor assembly 440 includes capacitor 442 that is configured to be coupled to the transmission or micro-strip line (not shown in FIG. 4b) via conductive ribbon leads 445a and 445b, respectively. An exemplary capacitor 442 can be an ultra-wideband capacitor, such as type 545L manufactured by American Technical Ceramics Corporation, and disclosed in a co-owned U.S. Pat. No. 7,248,458 to Mruz, the disclosure of which is incorporated herein by reference in its entirety. As illustrated in FIG. 4b, a coating 443 is configured to protect a circumferential channel (not shown in FIG. 4b) of the capacitor 442. The capacitance value of the capacitor assembly 440 can be similar to the capacitance value stated above with regard to the assembly shown in FIG. 4a. Referring back to FIG. 5g, the capacitor 546 can include ribbon leads that connect the capacitor assembly to the transmission line 547. Similarly to FIGS. 4a-b, the capacitance value of the entire assembly can be substantially equal to the capacitance value of the assemblies shown in FIGS. 4a-b. The assembly 540 further includes a low-loss dielectric element 549 (e.g., with a dielectric constant less than 10; as can be understood by one skilled in the art, materials with other dielectric constants can be used). In some embodiments, the thickness of the dielectric element 549 can be about 0.010 inches thick. The dielectric 549 is glued to the coil, and the capacitor is glued to its two legs 575a and 575b, as shown in FIG. 5g. The wire from the coil 544 tip is then directly connected to one of the two capacitor terminals. This forms the bias tee of 540. Because, there is no secondary coil, the low frequency end of this bias tee is about 2 MHz; the upper end is about 40 GHz. In some embodiments, when a secondary coil is included, the assembly 540 can cover the frequency range from below 16 KHz to above 40 GHz.

Figure 6:
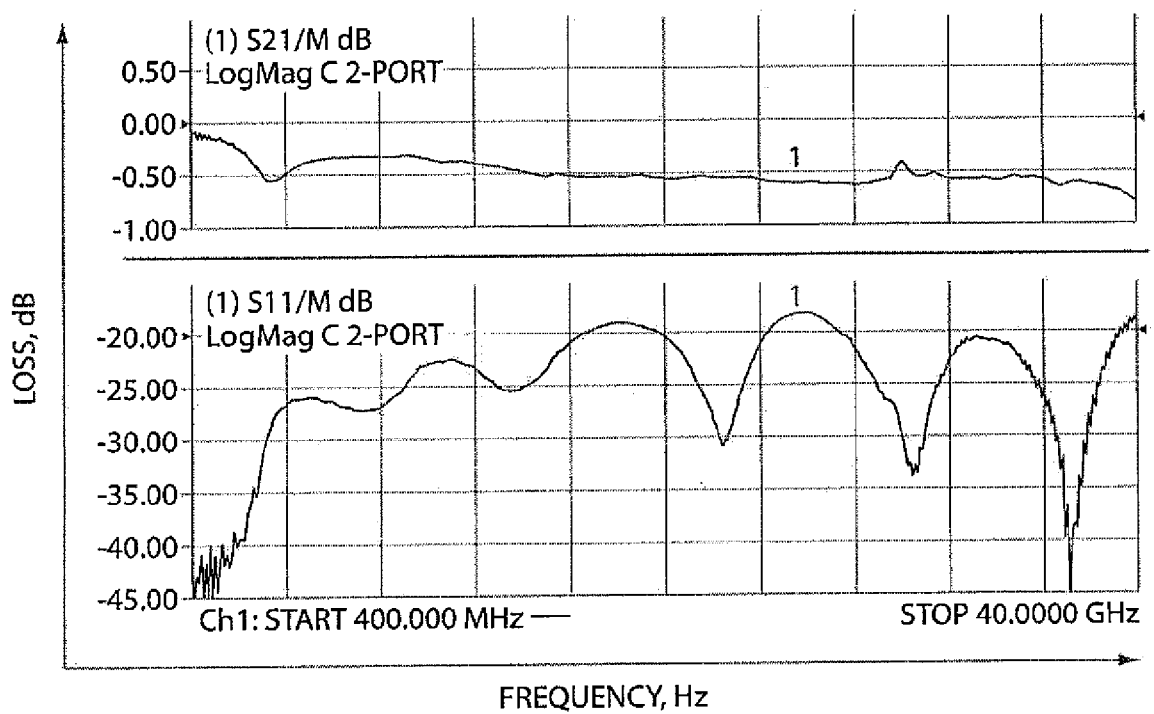
FIG. 6 illustrates two plots depicting insertion loss and return loss using bias-tee assemblies of the present invention.

FIG. 6 illustrates two typical plots depicting both the insertion loss and return loss characteristics of the bias tee assemblies illustrated in FIGS. 5a-f. As can be seen from the plots, no resonances were noted from 400 MHz to 40 GHz. Further, insertion loss and return loss remained below 0.8 dB and 15 dB, respectively. The device remains virtually resonance free to its lower 3 dB roll-off frequency which is typically below 100 KHz.

Example embodiments of the methods and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed:

1. An ultra-wideband assembly in an electric circuit having a circuit board having a transmission line, comprising:
   a non-conductive tapered core having a conductive wire wound on an outer surface of said non-conductive tapered core, said conductive wire having a proximate end and a distal end;
   a low-frequency inductor coupled to said non-conductive tapered core via said distal end of said conductive wire and configured to allow mounting of said non-conductive tapered core at an angle with respect to the circuit board;
   said low frequency inductor is being disposed on a dielectric board configured to be coupled to said circuit board;
   an ultra-wideband capacitor coupled to said non-conductive tapered core via said proximate end of said conductive wire;
   said ultra-wideband capacitor being coupled to said dielectric board and to the transmission line.

2. The assembly according to claim 1, further comprising a damping resistor being coupled to said low frequency inductor;
   an isolating resistor being coupled to said low frequency inductor; and
   wherein said damping resistor is configured to dampen resonant responses within said low frequency inductor;
   wherein said isolating resistor is configured to dampen potential interactions with a network and an electric DC feed line of said network being coupled to the assembly.

3. The assembly according to claim 2, wherein
   said damping resistor has a value of greater than 180 Ohms; and
   said isolating resistor has a value in a range of 0 Ohms to 100 Ohms.

4. The assembly according to claim 2, further comprising a bypass capacitor configured to bypass RF energy signals that manage to leak through said low frequency inductor and said non-conductive tapered core.

5. The assembly according to claim 4, further comprising a protective cover coupled to said low-frequency inductor and configured to protect components of said assembly.

6. The assembly according to claim 5, wherein said non-conductive tapered core further comprises
   a distal end; and
   a proximate end; and
   said distal end being larger than proximate end.

7. The assembly according to claim 6, wherein said non-conductive tapered core has a tetrahedron shape.

8. The assembly according to claim 6, wherein said non-conductive tapered core has a triangular pyramid shape.

9. The assembly according to claim 6, wherein said non-conductive tapered core has a multi-dimensional polygonal shape.

10. The assembly according to claim 6, wherein said non-conductive tapered core is composed of powdered iron.

11. The assembly according to claim 6, further comprising a dielectric disposed at said proximate end of said non-conductive tapered core.

12. The assembly according to claim 11, wherein said dielectric disposed along at least one tapering side of said non-conductive tapered core.

13. The assembly according to claim 6, wherein a surface area of said distal end is approximately equal to 0.0041 square inches.

14. The assembly according to claim 6, wherein a surface area of said proximate end is in a range from 0 square inches to 0.000025 square inches.

15. The assembly according to claim 6, wherein said tapered conductive core has a tapering angle, wherein said tapering angle is in a range of less than 10 degrees to greater than 25 degrees.

16. The assembly according to claim 6, wherein the assembly is configured to reduce insertion loss in a frequency range from below 10 KHz to over 100 GHz.

17. The assembly according to claim 6, wherein said proximate end of said conductive wire extends in a range from approximately 0 inches to approximately 0.010 inches away from said proximate end of said non-conductive tapered core.

18. The assembly according to claim 6, further comprising another dielectric layer being disposed on top of at least a portion of said conductive wire being wound on said non-conductive tapered core, said dielectric layer being disposed substantially near said proximate end of said non-conductive tapered core.

19. The assembly according to claim 18, further comprising a metal pad coupled to said dielectric layer at said proximate end of said non-conductive tapered core.

20. The assembly according to claim 19, wherein said dielectric layer is configured to extend away from said outer surface of said non-conductive tapered core.

21. The assembly according to claim 19, wherein said dielectric layer has a thickness of approximately 0.010 inches.

22. The assembly according to claim 21, wherein the dielectric material is manufactured from a material selected from a group consisting of: a hydrocarbon ceramic loaded glass, ceramic, ceramic reinforced glass or PTFE-based materials, PTFE materials reinforced with glass fibers, hydrocarbon ceramic composites, and rigid plastic.

23. The assembly according to claim 21, wherein said metal pad has a thickness of approximately 0.0007 inches.

24. The assembly according to claim 21, wherein said metal pad has a surface area of approximately 0.003 square inches.

25. The assembly according to claim 21, wherein said metal pad is manufactured from a material selected from a group consisting of copper, nickel, silver, gold and palladium.

26. The assembly according to claim 21, wherein the assembly is configured to be coupled to a circuit board in an electrical circuit.

27. The assembly according to claim 26, wherein said metal pad is configured to contact said proximate end of said conductive wire to generate a robust contact with a microstrip line of the circuit board.

28. The assembly according to claim 2, wherein a value of said damping resistor is in a range of 180 Ohms and higher.

29. The assembly according to claim 2, wherein a value of said isolating resistor is in a range of from 0 Ohms to 100 Ohms.

30. The assembly according to claim 3, wherein a value of said bypass capacitor is in a range of between 100 nF to over 220 nF.

\* \* \* \* \*